(12) United States Patent
Bolz et al.

(10) Patent No.: US 7,279,964 B2
(45) Date of Patent: Oct. 9, 2007

(54) DRIVE CIRCUIT, DEVICE, AND METHOD FOR SUPPRESSING NOISE, AND USE

(75) Inventors: Stephan Bolz, Pfatter (DE); Günter Lugert, Regensburg (DE); Simon Makar, Macomb, MI (US)

(73) Assignees: Siemens Aktiengesellschaft, Munich (DE); Siemens Vdo Automotive Corporation, Auburn Hills, MI (US)

( * ) Notice: Subject to any disclaimer, the term of this patent is extended or adjusted under 35 U.S.C. 154(b) by 730 days.

(21) Appl. No.: 10/630,108

(22) Filed: Jul. 30, 2003

(65) Prior Publication Data

US 2005/0024134 A1    Feb. 3, 2005

(51) Int. Cl.
  *H03F 3/38*    (2006.01)
(52) U.S. Cl. .................................... 330/10; 330/207 A
(58) Field of Classification Search .................. 330/10, 330/207 A, 251; 375/238
  See application file for complete search history.

(56) References Cited

U.S. PATENT DOCUMENTS 5,617,058 A * 4/1997 Adrian et al. ................. 330/10
5,903,819 A    5/1999 Romesburg ................... 455/63
6,356,151 B1 * 3/2002 Nalbant ....................... 330/10

FOREIGN PATENT DOCUMENTS

EP    0 878 001 B1    11/1996
EP    1293647    5/2003

* cited by examiner

*Primary Examiner*—Khanh Van Nguyen
(74) *Attorney, Agent, or Firm*—Baker Botts L.L.P.

(57) ABSTRACT

A low-frequency PWM-modulated signal and a high-frequency, unmodulated signal for generating a high-frequency PWM-modulated signal is employed directly for driving an output stage of a device for noise suppression. The low-frequency signal and the high-frequency signal is advantageously provided by a microcontroller which already has an AD converter on the input side. The microcontroller furthermore already makes a PWM output signal with a high bit width available which has the high resolution necessary for driving the loudspeaker.

20 Claims, 7 Drawing Sheets

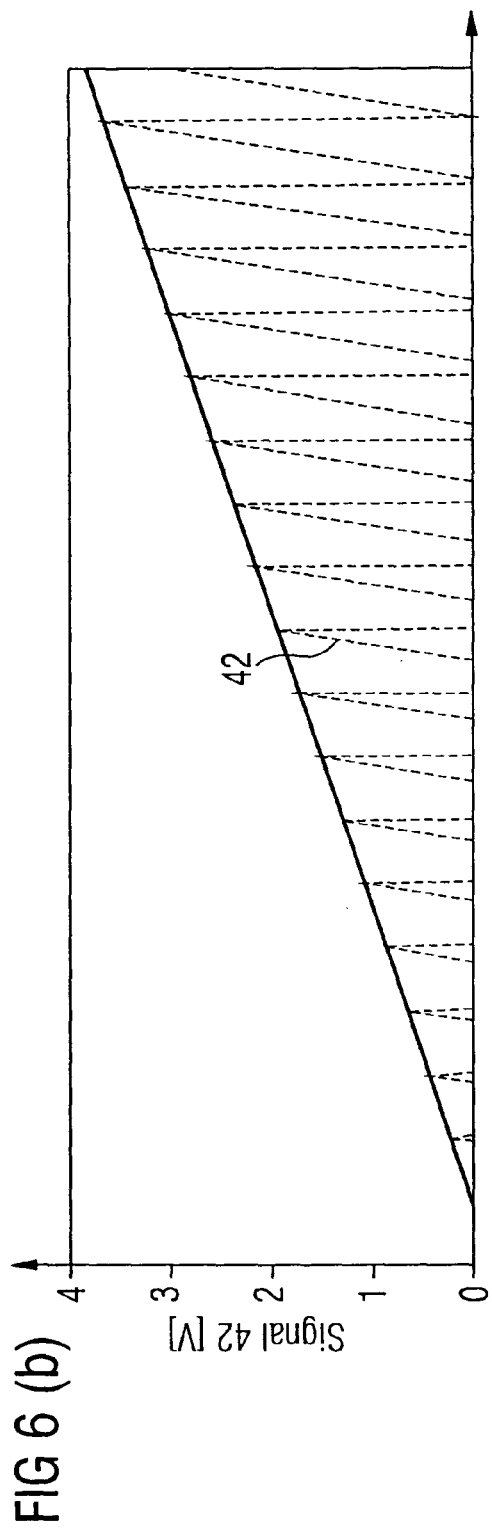
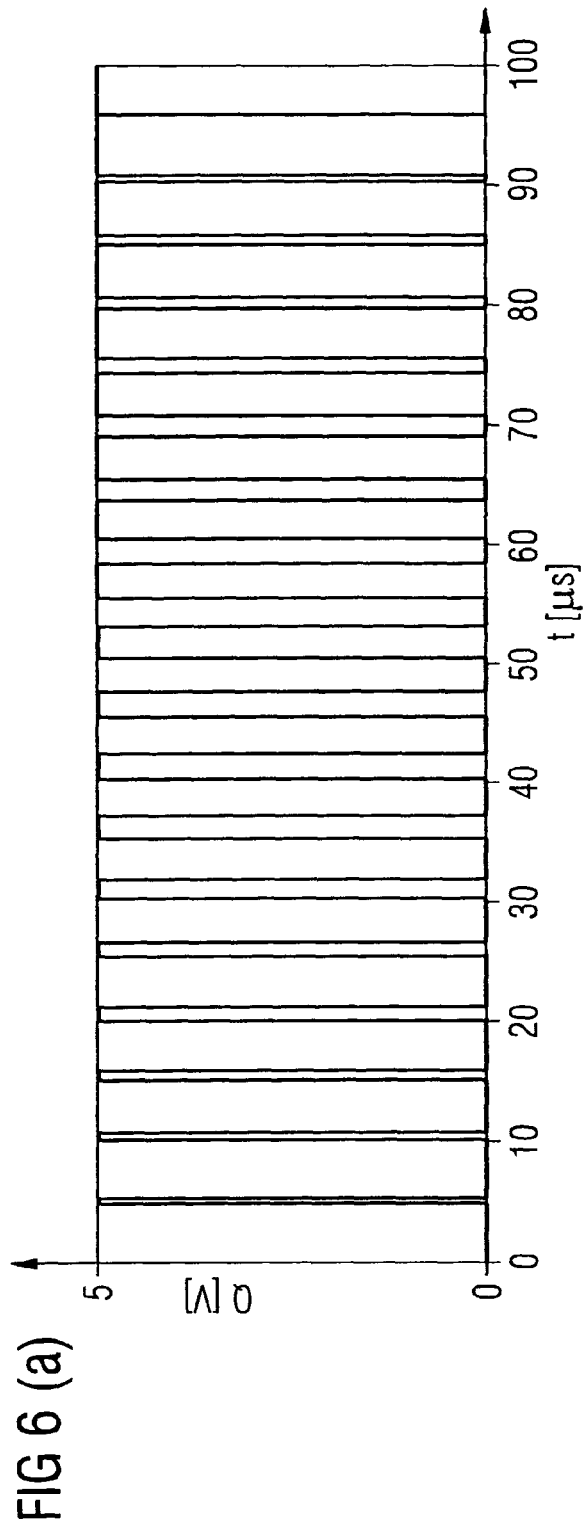
FIG 6 (b)
FIG 6 (a)

DRIVE CIRCUIT, DEVICE, AND METHOD FOR SUPPRESSING NOISE, AND USE

TECHNICAL FIELD TO THE INVENTION

This invention relates to a drive circuit, particularly in a device for suppressing the noises of a motor vehicle. The invention further relates to a device and method for suppressing noise and to a use.

BACKGROUND OF THE INVENTION

With modern motor vehicles there is a need to reduce the undesirably produced noises in the motor vehicle as much as possible. Alongside the engine frame, the intake section constitutes a main source of these vehicle noises over a wide range of speeds. The noise in the intake section can be damped by means of several passive Helmholtz resonators integrated in the intake section. Although these resonators designed as plastic molded parts are relatively inexpensive and easy to produce, they take up a large amount of space especially when low-frequency noises have to be damped. As, moreover, today's motor vehicles are exceptionally compact in design, particularly in the engine area, the use especially in the confined engine compartment of such space-consuming resonators causes substantial design problems. A further problem arises from the fact that the engine's sound characteristics are not easily influenced by these passive damping means.

For these reasons there are various methods and devices for influencing noise emissions by electronic means. Such devices for electronic noise suppression are also referred to as Active Noise Canceling (ANC) devices.

In ANC systems the noise being damped is registered by means of a microphone then appropriately filtered and inverted. Inversion is typically effected by means of a 180° phase rotation of the registered noise signal. The noise signal having been thus filtered, amplified, and inverted is fed out by means of a loudspeaker and superimposed on the signal being damped, as a result of which the two noise signals are canceled out owing to interferences.

A device of this type is described in, for example, European patent EP 878 001 B1.

With the aid of a schematic block diagram, FIG. 1 shows the basic principle of an ANC system as employed, for instance, in a motor vehicle. Alongside a microphone 102 for registering a noise signal being damped, an ANC system has an amplifier 110 connected downstream in the circuit for appropriately amplifying this noise signal. Connected at the output side downstream of the amplifier 110 is an electronic regulator 140, an output stage 119 for driving a loudspeaker, and a loudspeaker 105. The regulator 140 contains a digital signal processor (DSP) and a codec circuit. The codec circuit essentially contains an input-side analog/digital converter for digitizing the analog noise signal and a digital/analog converter for converting the appropriately conditioned noise signals back into an analog output signal. The DSP processor performs, among other things, the function of digitally filtering and calculating an output signal.

With the aid of a schematic block diagram, FIG. 2 shows a more detailed representation of an ANC system with a digital signal processor and an output stage of class D design.

The inverted noise signals fed out by the loudspeaker 105 for the purpose of noise suppression are appropriately amplified by the upstream output stage 119. The performance of the loudspeaker 105, and hence the quality of noise suppression, essentially depends on the output stage. The loudspeakers require a maximum loudspeaker power $P_{max}$ of approximately 30 watt. Although class AB or B linear amplifiers will, if used as output stages, provide the required performance, their efficiency $\eta$ is only around 60%. The power dissipation PV generated by the output stage will then be as follows:

$$P_V = P_{max}*(1-\eta) = 30W*(1-0.6) = 12 \text{ watt.}$$

In the case of maximum loudspeaker power $P_{max}$ of 30 watt and 60% efficiency, the output stage 119 thus generates around 12 watt power dissipation $P_V$, which is mainly manifested through heating of the relevant sections of the circuit. This, however, means that additional, expensive cooling measures are required for the output stage. Furthermore, this extensive heating is a factor which in itself renders such output stages unsuitable for miniaturization.

Class D output stages 119 are therefore typically employed for driving loudspeakers. These offer optimum efficiency and very low power dissipation, so are particularly suitable for miniaturization. A class D output stage 119 of this type has a PWM modulator 136 (PWM=Pulse Width Modulator), a downstream output stage driver 121, and a downstream bridge circuit 120 with power MOSFETs. The analog input signal is first converted by means of the PWM modulator into a digital signal with a fixed frequency and a pulse duty factor proportional to the voltage. This converted digital signal is used to drive the power transistors, with these being operated exclusively in switched mode. This prevents the occurrence of the losses with a principle cause that ensue in the case of linear output stages when the supply voltage is divided between the transistor and loudspeaker.

Class D output stages are today typically produced as fully integrated circuits. However, a problem associated with the use of class D output stages is that they are relatively expensive to produce owing to the degree of accuracy required for the PWM modulator. This is compounded by the fact that signal processing in the codec circuit 109 requires a digital signal processor 108 specially provided for this which, moreover, is hardly ever employed for any other functions. However, the use of a digital signal processor 108 solely for the purpose of noise suppression makes the entire system more expensive.

Finally, in order to meet the accuracy requirements for driving the PWM modulator it is necessary to employ an automobile-compatible 12-bit digital/analog converter at the output of the codec circuit 109. To allow fast and hence dynamic conversion, a parallel converter is typically employed here which, however, is relatively expensive.

The functions of a DSP and of a AD converter could, for example, also be performed by a microcontroller as this already has an analog/digital converter on the input side and, in the case of, for instance, a 32-bit microcontroller, offers excellent real-time performance. Furthermore, the functionality of a digital signal processor could be advantageously combined here with other functional properties, for example an engine control or a control device, which would have considerable cost advantages and permit the entire electronic circuit to be significantly miniaturized.

Microprocessors are not, however, used at present for driving a loudspeaker for noise suppression proposes. The reason for this is the necessary resolution of the drive signal of the loudspeaker of 12 bits and a necessary clock frequency of the microcontrollers—currently available for automotive applications—of approximately 40 MHz. The PWM clock frequency $f_{PWM}$ derived from this is as follows:

$f_{PWM}$=40 MHz/$2^{12}$=9.76 kHz.

Although class D output stages can be operated with a PWM clock frequency of approximately 10 kHz, the filter elements at the output of the output stage would then be exceptionally large. Moreover, a higher-order output filter would then be necessary because the PWM frequency is in the audible range, which would in turn necessitate a lowering to below the threshold of perception.

However, PWM frequencies of approximately 200 kHz are required for ANC systems for noise suppression purposes because a highly advantageous compromise can be achieved here between the costs relating to the size of the filter elements on the one hand and the losses due to switching reasons of the power transistors of the class D output stage on the other hand.

SUMMARY OF THE INVENTION

Proceeding from this, the object of the present invention is to facilitate simpler, in particular more economical noise suppression in conjunction with a high degree of efficiency.

This object can be achieved by a drive circuit for driving an output stage of a device for noise suppression, in particular in a motor vehicle, comprising a first input for coupling in an unmodulated first clock signal of a first frequency, a second input for coupling in a PWM-modulated second clock signal of a second, lower frequency, a modulator circuit which from the first clock signal generates a PWM-modulated third clock signal of the first frequency which can be tapped at the PWM output of the drive circuit, and a regulating circuit which regulates the pulse width of the third clock signal until the sum of the pulse duty factors of the second clock signal and of the inverted third clock signal is 100%.

The regulating circuit may have an addresser which generates a first regulating signal from the sum of the second clock signal and of the inverted third clock signal. The addresser may have a first voltage divider whose resistors have the same conductance. The regulating circuit may have a first comparator which generates the first regulating signal for driving the modulator circuit as a function of a difference between a reference potential and a summation signal generated by the addresser. For generating the reference potential a second voltage divider may be provided which is located between terminals of a supply voltage source. The regulating circuit can be designed as a PID regulator and/or as an I regulator. The modulator circuit may have a NAND gate, a downstream ramp generator, second comparator, and flip-flop. The ramp generator may have a switchable current source and an integration capacitor for generating a ramp voltage. The second comparator can be connected on the input side to the output of the ramp generator and to the output of the regulating circuit, with the second comparator comparing the ramp voltage with the first regulating signal and, as a function of this, generating a trigger signal for triggering the flip-flop. The flip-flop can be connected on the input side to the first input and to the output of the second comparator, with the flip-flop making the third clock signal and a clock signal inverted with respect to this available at the output as a function of the trigger signal and of the first clock signal. The drive circuit can be a component part of a program-controlled unit, in particular of a microcontroller or microprocessor.

The object can also be achieved by a device for electronic noise suppression, in particular for a motor vehicle comprising a microphone for registering noises, a loudspeaker for feeding out acoustic signals for noise suppression, a circuit arrangement for driving the loudspeaker according to the registered noises which has a drive circuit for provisioning a PWM-modulated clock signal, and an output stage which is connected immediately downstream of the drive circuit and which drives the loudspeaker. The drive circuit comprises a first input for coupling in an unmodulated first clock signal of a first frequency, a second input for coupling in a PWM-modulated second clock signal of a second, lower frequency, a modulator circuit which from the first clock signal generates a PWM-modulated third clock signal of the first frequency which can be tapped at the PWM output of the drive circuit, and a regulating circuit which regulates the pulse width of the third clock signal until the sum of the pulse duty factors of the second clock signal and of the inverted third clock signal is 100%.

The output stage can be designed as a class D amplifier. The output stage may have a driver circuit and a bridge circuit, in particular a full bridge, which is connected downstream of the driver circuit. A program-controlled unit, in particular a microcontroller or microprocessor, can be provided which is connected immediately upstream of the drive circuit or which has the drive circuit. The output stage can be driven directly by a microcontroller.

The object can also be achieved by a method for driving an output stage of a device for noise suppression, in particular in a motor vehicle, comprising the steps of generating from an unmodulated first clock signal of a first frequency and from a PWM-modulated second clock signal of a second frequency, which is lower than the first frequency, a PWM-modulated third clock signal of the first frequency whose pulse duty factor continues being increased on a regulated basis until the sum of the pulse duty factors of the second clock signal and of the third clock signal is 100%, using the frequency of the first clock signal as a control variable, and using the third clock signal made available on the output side as a regulating variable for regulation. The first and/or second clock signal can be made available by a program-controlled unit. A flip-flop can be used for generating the pulse width of the PWM-modulated third clock signal.

Furthermore, a microprocessor or microcontroller can be used for directly driving an output stage, in particular a class D output stage, with a PWM-modulated clock signal in a device for electronic noise suppression.

The idea underlying the present invention consists in surmounting the gap between the relatively low PWM frequency that can be achieved with a high bit resolution using a microcontroller and the high PWM frequency required for operating a class D output stage. The present invention is based on the knowledge that, contrary to technical specialists' hitherto prevailing understanding (which was briefly outlined above), it is certainly possible to employ a microcontroller here.

A microcontroller offers the advantage that, on the one hand, it already has an AD converter at its input and, on the other hand, that it in any event delivers a PWM signal at its output. However, this PWM signal has a clock frequency that is too low. To be able to use this PWM signal for driving a downstream output stage, according to the invention a regulated PWM modulator has been provided whose unmodulated or only slightly modulated clock frequency originates, for example, from the microcontroller and whose pulse duty factor is derived from a PWM signal also originating from the microcontroller. Proceeding from this, the PWM modulator generates a PWM signal at the output side with a much higher clock frequency compared to the frequency of the PWM signal routed to the input side. This higher clock frequency is advantageously sufficient to drive a downstream class D output stage. The difference in pulse duty factors between the PWM signal of the microcontroller and the PWM signal generated by the PWM modulator serves as an error gauge for regulation purposes.

The particular advantage of the invention lies in being able to dispense with a digital signal processor. Rather a microprocessor which is typically present in any event can be used for the ANC system. A commercially available 16-bit or 32-bit microcontroller of this type is cheaper than a digital signal processor and is particularly suitable on account of its greater flexibility. Apart from noise suppression, this microcontroller can in particular additionally or alternatively perform other diagnostic and communication functions in the motor vehicle. For example, alongside its function as a component in an ANC system, the microcontroller could also be used as a bus controller of a CAN (Controller Area Network) bus system. This advantageously reduces circuit-related costs and hence also the costs of an ANC system according to the invention compared to conventional ANC systems cited at the start.

In order to ensure the high resolution necessary for noise suppression, an analog/digital converter (AD converter) with a minimum 12-bit resolution is required which, furthermore, performs it conversion operations as dynamically and as quickly as possible. A 12-bit AD converter of this type is, however, relatively expensive, especially when signal conversion has to be performed very quickly. A microcontroller advantageously already has an AD converter of this type, which renders the additional provisioning of an AD converter unnecessary.

Furthermore, duplicated conversion of the loudspeaker drive signals is not necessary, either, which is also a cost advantage.

The drive circuit according to the invention allows the elements of the output filter, in particular its inductors and capacitors in the case of a low-pass filter, to be dimensioned to a very small scale, as a result of which the entire output filter offers cost advantages owing to the possibility of miniaturization.

A further advantage of the drive circuit according to the invention is that it allows the loudspeaker's output stage to be driven directly. In particular, this will then obviate the need for a digital/analog converter to drive the output stage, which is also a cost advantage.

Another aspect of the circuit according to the invention which should not be left out of account is that its elements are very easy to implement using standard components. As the drive circuit according to the invention allows a class D output stage to be used which in terms of power dissipation offers an optimized switching topography, the entire drive circuit, the output stage, and hence the entire ANC system can be of optimized integrated design.

BRIEF DESCRIPTION OF THE DRAWINGS

The invention is described in greater detail below with reference to the embodiments shown in the schematic figures of the drawing, in which:

FIG. 6 shows the control characteristic of the PWM modulator;

DETAILED DESCRIPTION OF THE PREFERRED EMBODIMENTS

Figure 1:
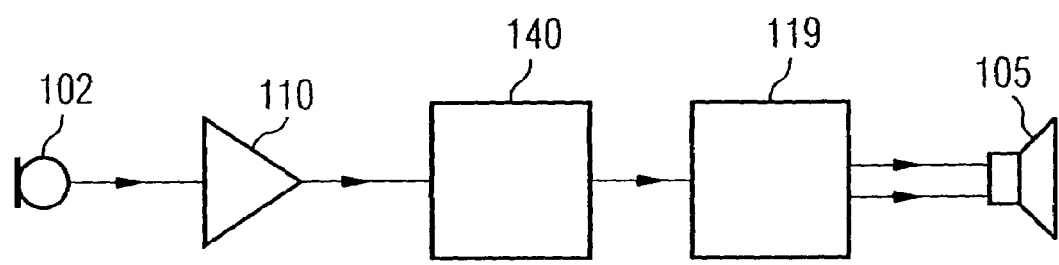
FIG. 1 shows a known ANC system with the aid of a block diagram.
Figure 2:
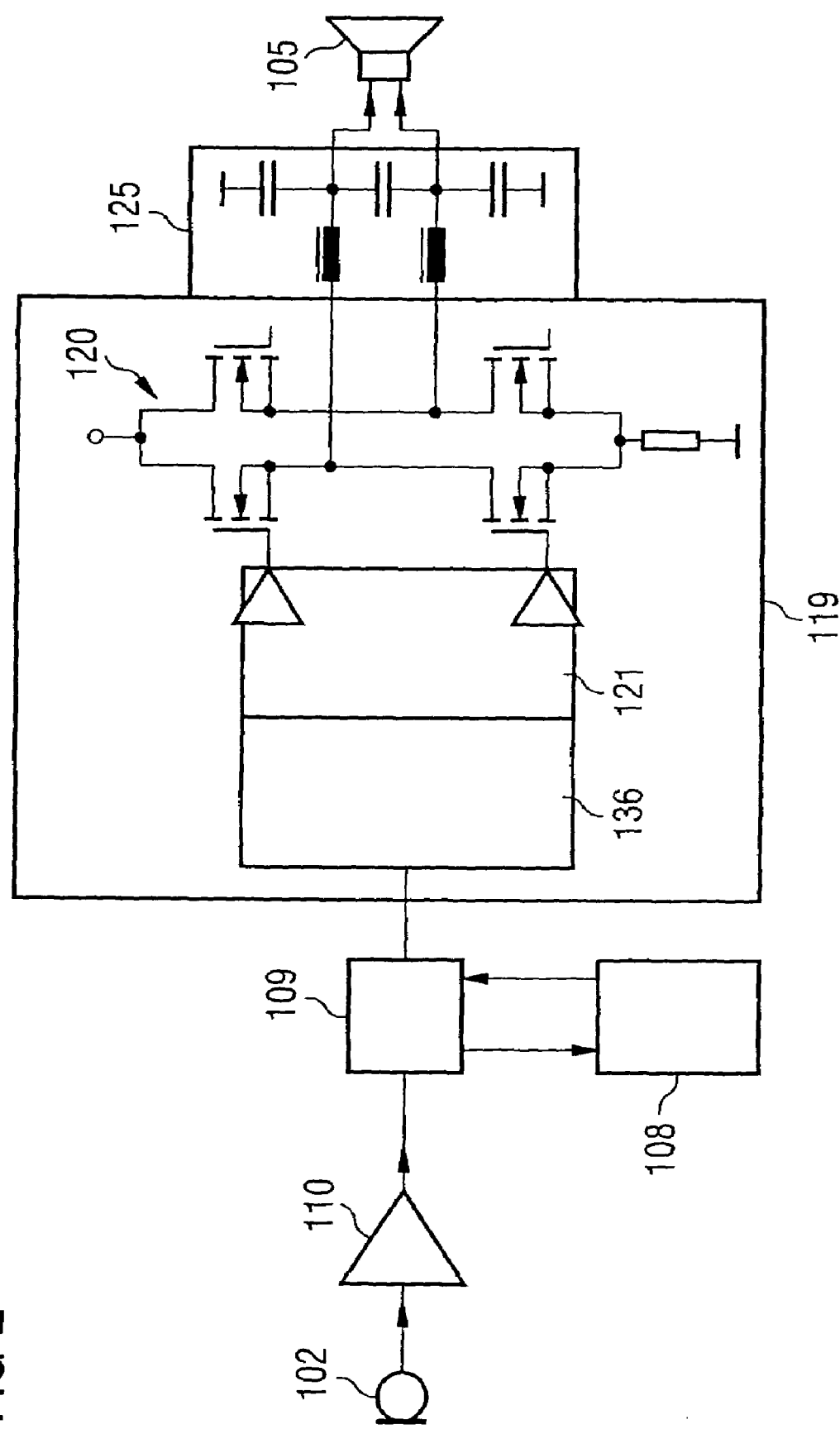
FIG. 2 shows a block diagram of a detailed representation of a known ANC system.

Unless indicated otherwise, identical or functionally similar elements, signals, and functions have been given the same designation in all the figures of the drawing.

Figure 3:
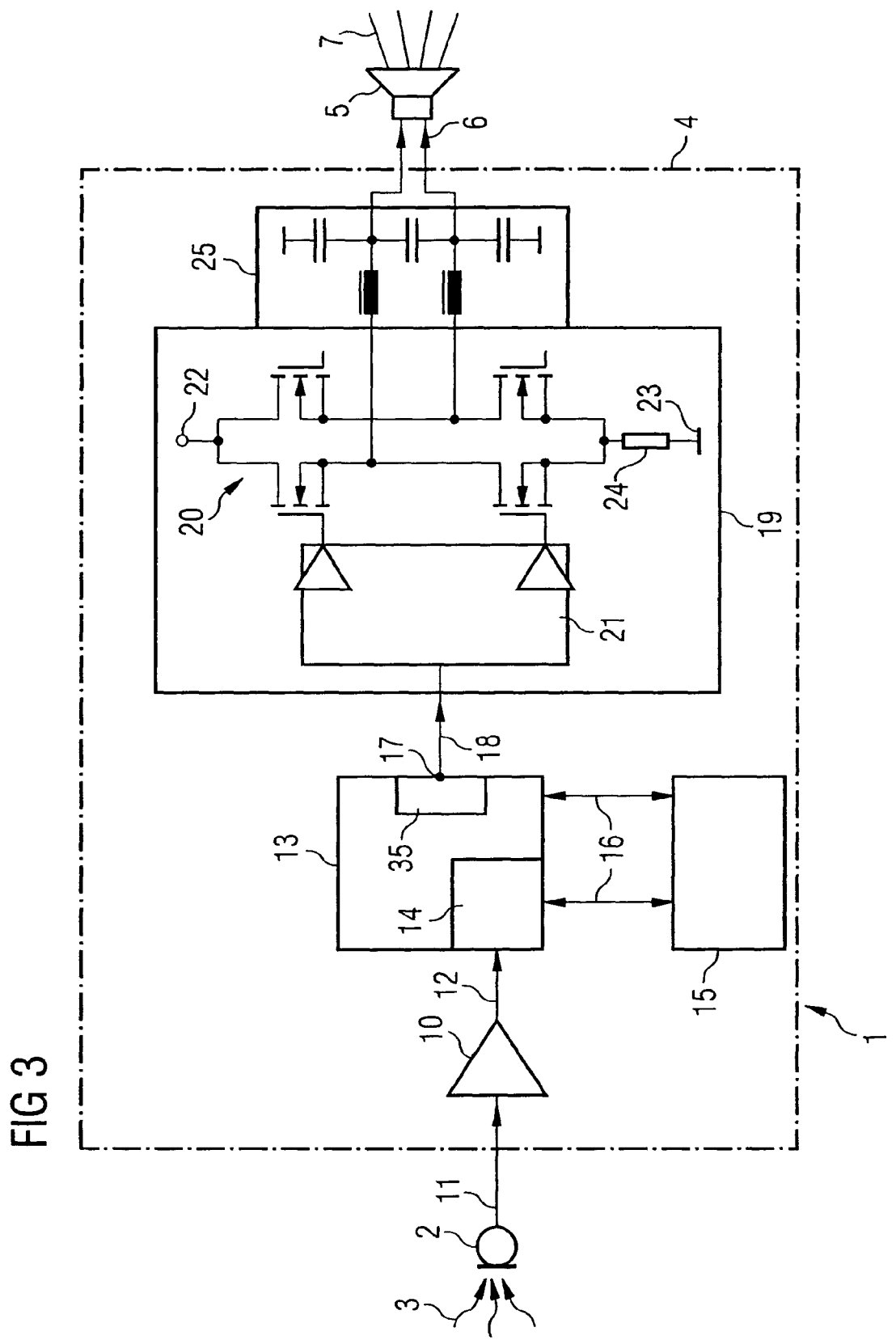
FIG. 3 shows a block diagram of an ANC system according to the invention which has a drive circuit for a loudspeaker, a microcontroller, and a direct PWM drive.

In a block diagram, FIG. 3 shows a representation of an ANC system according to the invention with a drive circuit according to the invention.

The ANC system according to the invention is identified in FIG. 3 by reference numeral 1. The ANC system 1 is suitable for suppressing noises generated by, for example, an internal combustion engine, its intake section or the exhaust of a motor vehicle. The ANC system 1 has a microphone 2 via which the noises 3 being damped or suppressed are registered. Connected downstream of the microphone 2 is a drive circuit 4 to which a signal derived from the noise 3 is routed and which on the output side generates drive signals 6 for driving a loudspeaker 5. As a function of drive signals 6, the loudspeaker 5 generates acoustic signals 7 which, on being superimposed on the noises being suppressed, largely eliminate these noises or at least damp them.

The drive circuit 4 has a pre-amplifier 10 to which the analog output signal 11 is routed and which appropriately amplifies this analog signal 11. The analog signal 12 amplified in this way is routed to a downstream microcontroller 13. On the input side the microcontroller 13 has an analog/digital converter 14 (AD converter) which converts the analog signal 12 into a digital signal. Also provided is a memory 15, for example a RAM or SRAM, which is connected to the microcontroller 13 via a bi-directionally operable data/address bus 16. The microcontroller has a PWM output 17 at which a PWM-modulated output signal 18 can be tapped. The PWM signal 18 is derived from the analog signal 12. This PWM signal 18 is routed to an output stage circuit 19 downstream of microcontroller 13.

In the present embodiment the output stage circuit 19 is a class D output stage. The output stage circuit 19 contains a bridge circuit 20, designed here as a full bridge. The full bridge 20 consists in the present example of four power transistors, n-channel MOSFETs, for example, whose control terminals are driven via a driver circuit 21. In the present embodiment the bridge circuit 20 is located between a first terminal 22 with a first supply potential, for example a positive battery potential VCC, and a second supply terminal 23 with a second supply potential, for example the potential of the ground reference GND. A load resistor 24 is located between the bridge circuit 20 and second supply terminal 23 so that the power transistors of the bridge circuit 20 are designed as high-side switches.

Typically, but not necessarily, a low-pass filter 25 is connected downstream of the class D output stage circuit 19 in order to reduce the EMC radiation generated by the switching edges in the analog output signal 6. For this purpose, in a known manner the low-pass filter has inductors and capacitors (LC elements) between the power transistors of the output stage 19 and the loudspeaker 5.

The generation of a PWM signal 18 for driving an output stage circuit 19 using a microcontroller is described in greater detail below with the aid of FIG. 4.

Figure 4:
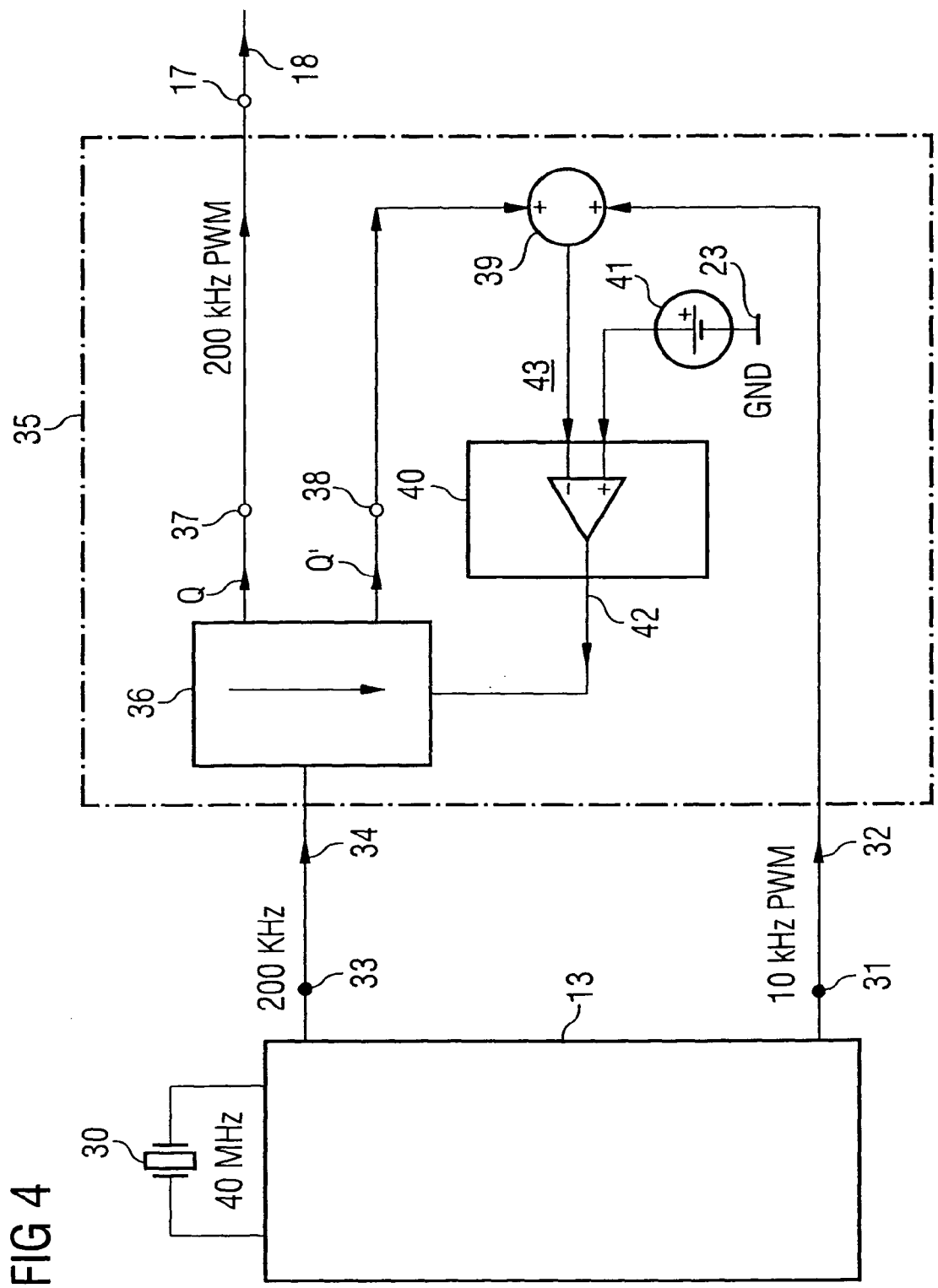
FIG. 4 shows a general representation of a circuit arrangement of a microcontroller according to the invention with a direct PWM drive.

FIG. 4 shows a microcontroller 13, for example a 32-bit microcontroller. The microcontroller 13 is connected to a device 30 for provisioning a system clock, for example with a frequency of 40 MHz. The microcontroller 13 has a first output 31 for provisioning a PWM signal 32 whose pulse duty factor is generated with high resolution, for example 12 bits, by means of regulating software in the microcontroller 13. The currently present pulse duty factor corresponds here to a required voltage value for driving the loudspeaker 5. In the embodiment in FIG. 4 the frequency of the PWM signal 32 is 10 kHz, for example.

The microcontroller 13 also has a second output 33 at which an unmodulated (or also a weakly modulated) signal 34 with a frequency of, for example, 200 kHz can be tapped. The pulse duty factor of this unmodulated signal 34 is generally of no relevance. However, a signal 34 with clock pauses that are as short as possible is advantageously used to make it easier to control a PWM modulator.

According to the invention, a PWM regulating circuit 35 is connected downstream of the outputs 31, 33 of the microcontroller 13. The PWM regulating circuit 35 has a PWM modulator 36 whose input is connected to the second output 33 of the microcontroller 13. The PWM modulator 36 has two outputs 37, 38. The PWM signal 18 (Q signal) can be tapped at the first output 37, which is connected to the PWM output 17. The PWM signal 18 has a frequency of 200 kHz.

At second output 38 it is possible to tap the output signal Q', inverted with respect to the signal Q, which thus also has the frequency of 200 kHz. This inverted PWM signal Q' is routed to an adding device 39 to which the 10-kHz PWM signal 32 of the first output 31 of the microcontroller 13 is routed in addition. These two signals Q', 32 are added together and routed to an inverting input of a downstream regulator 40. In the present embodiment the regulator 40 is designed as a PID regulator. The second input of the regulator 40 is connected to the second supply terminal 23 via a reference voltage source 41. The regulator 40 generates a control signal 42 at the output side for driving the PWM modulator 36.

The inverting output 38 of the PWM modulator 36, the adding device 39, and the regulator 40 form a feedback branch of the PWM regulating circuit 35, with the inverted PWM signal Q' being employed as a regulating variable and the PWM signal 32 forming a control variable.

The signal 34 which can be tapped at the second output 33 of the microcontroller 13 clocks the downstream PWM modulator 36, which in turn generates two 200 kHz PWM signals Q, Q' which are mutually inverted. The pulse width of these two PWM signals Q, Q' is controlled by the regulator 40. The regulator 40 continues changing the pulse width of the output signals Q, Q' generated by the PWM modulator 36 until the sum of the pulse duty factor of the 10-kHz PWM signal 32 and the pulse duty factor of the inverted 200-kHz PWM signal Q' is 100%. The PWM signal Q and the PWM signal 32 then have exactly the same pulse duty factor. The upper cut-off frequency of the regulator 40 is chosen such that, on the one hand, the frequency of 10 kHz of the PWM signal 32 cannot occur as a modulation in the PWM signal Q and, on the other hand, such that the modulation frequency, for example 600 Hz, is reproduced exactly.

For clarity's sake the PWM regulating circuit 35 has been shown in FIG. 4 as an autonomous unit separate from the microcontroller 13. Alternatively, the PWM regulating circuit 35 can, however, also be a component part of the microcontroller 13, which means it would then be possible to tap the PWM signal Q at the output of the microcontroller 13.

Figure 5:
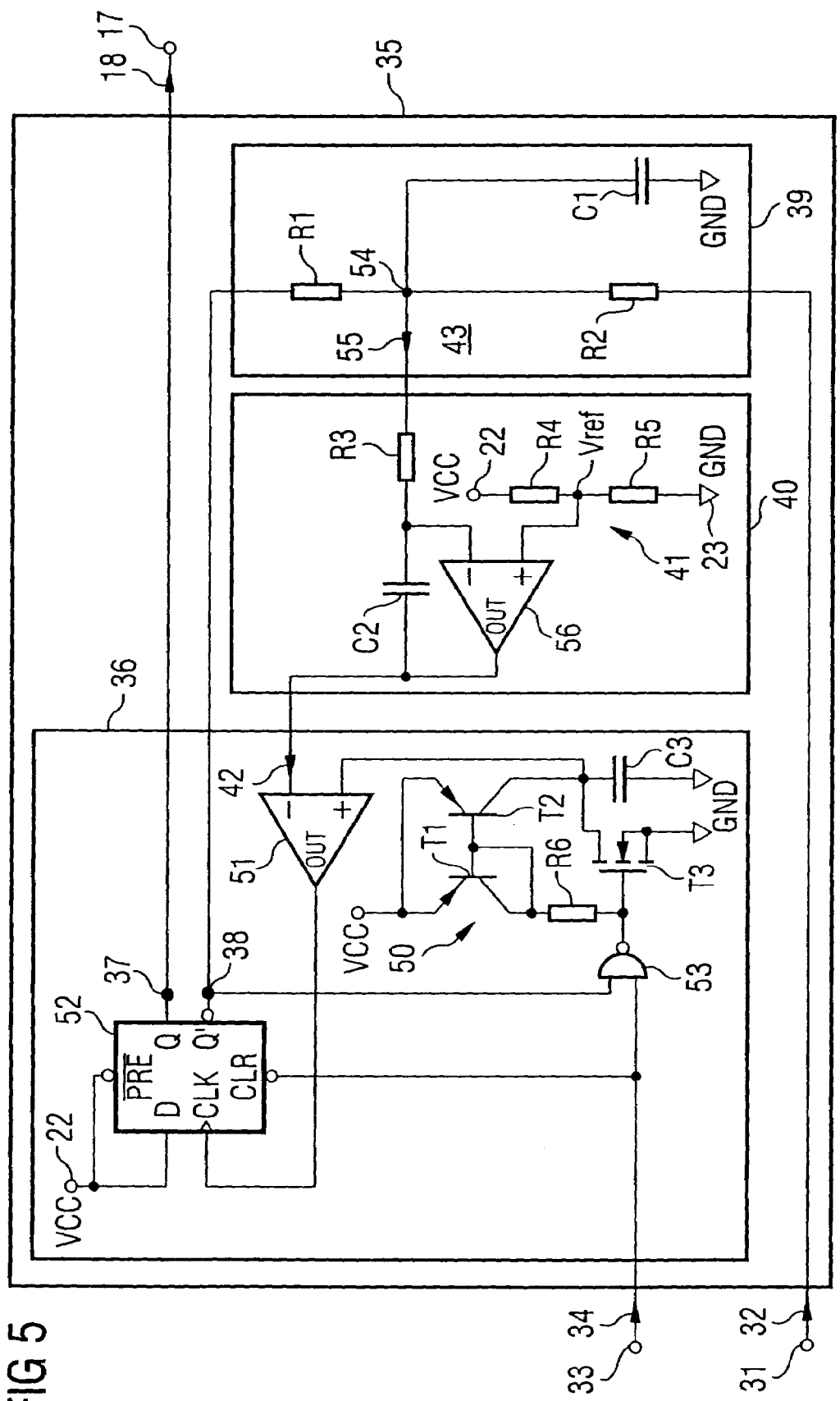
FIG. 5 shows a first embodiment of a PWM regulating circuit according to the invention.

With the aid of a schematic circuit diagram, FIG. 5 shows a first embodiment of the implementation of a PWM regulating circuit 35 in circuitry form. The PWM modulator 36 of the PWM regulating circuit 35 contains a ramp generator 50, a comparator 51, a flip-flop 52, and a NAND gate 53. The ramp generator 51 contains a switchable current balancing circuit with the resistor R6 and the transistors T1, T2, an integration capacitor C3, and a resetting transistor T3. The ramp generator 51 is located between the supply terminals 22, 23.

The NAND gate 53 is connected by means of its first input to the second output 33 of the microcontroller 13. The second input of the NAND gate 53 is connected to the inverting output 38 of the PWM modulator 36. On the input side the PWM signals 34 and Q' are thus routed to the NAND gate 53. The NAND gate is coupled on the output side to an input of the ramp generator 50. The output of the ramp generator 50 is connected to an input of the comparator 51. The inverted input of the comparator 51 is connected to the output of the regulator 40. The output of the comparator 51 is connected to a clock input CLK of the flip-flop 52. This flip-flop 52 is connected by means of its first input CLR to the output 33 of the microcontroller 13. A second input PRE of the flip-flop 52 is connected to the first supply terminal 22. At the output side the flip-flop 52 generates the PWM signal Q and the PWM signal Q' inverted with respect to it.

The output of the NAND gate 53 controls the ramp generator 50 with a drive signal. If its value is low, it means the resetting transistor T3 has been deactivated. In addition, the base point of the resistor R6 is then close to the potential of the ground reference GND, which results in a flow of current through resistor R6 and through the transistor T1, switched as a diode, of the current balancing circuit R6, T1, T2. Because the control terminals of the current balancing transistors T2, T1 are short-circuited, the result is a current balancing circuit where—if the transistor areas are equal— approximately the same current flows through the current balancing transistors T1, T2. The current flowing through the transistor T2 then charges the integration capacitor C3 linearly with increasing time so that a voltage ramp is generated. It is important to note that at the end of each 200-kHz clock the voltage at the capacitor C3 is definitely below the saturation voltage of the current balancing circuit R6, T1, T2 or below the maximum input voltage of the comparator 51.

The comparator 51 then compares the ramp voltage generated in this way and the regulating signal 42 made available on the output side by regulator 40 serving as a reference value. The ramp voltage at the capacitor C3 then continues rising until it reaches the value of the output voltage 42 generated by the regulator 40, whereupon the output of the comparator 51 jumps from a logically low value (LOW) value to a logically high value (HIGH). This triggers the flip-flop 52. The signal Q' at the inverting output 38 of the flip-flop 52 jumps in a corresponding manner from HIGH to LOW, thereby switching the input of the NAND gate 53 connected to this output 38 to HIGH. Because the current through the current balancing transistor T2 has now become zero, on the one hand the current balancing circuit T1, T2, R6 is deactivated and, on the other hand, the resetting transistor T3 is activated, whereupon the integration capacitor C3 discharges very quickly. The ramp generator 50 has thereby been reset to 0 volt.

If—possibly owing to overdriving of the regulator 40—the voltage of the ramp generator 50 does not reach the second reference value 42 generated by the regulator 40, the ramp generator 50 will be reset by the 200-kHz signal 34 at the end of each clock.

The unmodulated 200-kHz signal 34 preferably has a relatively long HIGH phase of, for example, about 50 µs and an as short as possible LOW phase of, for example, 12.5 ns with a clock frequency of the microcontroller 13 of 40 MHz. Although the consequence of this is that a very small percentage of approximately 0.4% of the possible PWM range will be lost, it will have no, or virtually no impact on the attainable resolution; it will only limit the maximum attainable peak value of the drive signal 6 for driving the loudspeaker 5.

The addresser 39 contains a voltage divider consisting of the resistors R1, R2. These resistors R1, R2 are advantageously identically dimensioned and so have the same impedance. The PWM signal 32 of the microcontroller 13 and the inverted output signal Q' (200-kHz signal) generated by the flip-flop 52 are added in this way. The addition of these two signals 32, Q' produces a regulating signal 55 which is routed to the regulator 40 via the pre-resistor R3.

In conjunction with the resistors R1, R2, a capacitor C1 connected to the center tap 54 of the voltage divider R1, R2 forms a low pass which filters the mean dc voltage value of the two PWM signals 32, Q'. Because the two PWM signals 32, Q' should have an opposing pulse duty factor, at a supply voltage of, for example, 5 V the result is a mean dc voltage value of 2.5 V. This potential (2.5 V) is being applied to the center tap 54 and hence also to the capacitor C1.

In another embodiment, the low-pass filter consisting of the elements R1, R2, C1, and hence the low-pass effect of the adding circuit 39, could be further improved by designing this low-pass filter R1, R2, C1 together with the regulator 40 as a higher-order filter.

In the embodiment in FIG. 5 the regulator 40 is designed as an integrator (I regulator). It is, of course, also possible to use other types of regulators here, such as a PID regulator or PI regulator and the like, with an accompanying requirement to adapt the circuit 35 from FIG. 5 to this.

The regulator 40 has an amplifier 56 into whose inverting input the signal 55 is coupled. A reference potential Vref is coupled into the non-inverting input of the amplifier 56. A voltage divider consisting of the resistors R4, R5 located between the supply terminals 22, 23 is provided to form this reference potential Vref. In the event that the voltage divider resistors R4, R5 in each case have the same resistance value, there will then be a reference potential Vref from half the supply voltage VCC/2. The amplifier 56 of the regulator 40 compares the signal 55 acquired in the addresser 39 with the reference potential Vref and, from a possibly present differential voltage between the input signal 55 and the reference potential Vref, acquires a regulating variable which ultimately determines the regulating voltage 42 at the output of the regulator 40. This output voltage 42 serves as a second reference value for controlling the downstream PWM modulator 36.

As the entire circuit arrangement and hence also the regulator 40 are fed overall from the supply potentials VCC, GND—meaning that all the signal levels are either VCC or 0 V—the impact on the PWM-modulated signal Q, Q' of voltage fluctuations in the supply voltage is virtually totally eliminated by the voltage divider R4, R5 for generating the reference voltage.

With the aid of signal-time diagrams, FIG. 6 shows the control characteristics of the comparator 51 and of the ramp generator 50. As an illustration, the signal 42 as a second reference value is here slowly changed from 0 V to around 4 V (see FIG. 6(a)). The pulse duty factor of the non-inverting output signal Q of the flip-flop 52, which means the 200-kHz PWM signal Q, at the same time changes continuously from a modulation of approximately 0% to close to 100% (see FIG. 6(b)).

The flip-flop 52 is initially reset from the short LOW level of the unmodulated signal 34 (200-kHz signal). The ramp generator 50 is simultaneously reset by this signal 34 via the NAND gate 53, then enabled. If the comparator 51 switches when the ramp voltage reaches the second reference value of the signal 42, the flip-flop 52 will be triggered by the output signal of the comparator 51. A synchronous pulse-width modulated signal Q (200-kHz signal) whose pulse width is controlled by the ramp generator 50 therefore appears at the non-inverting output 37 of the flip-flop 52.

Figure 7:
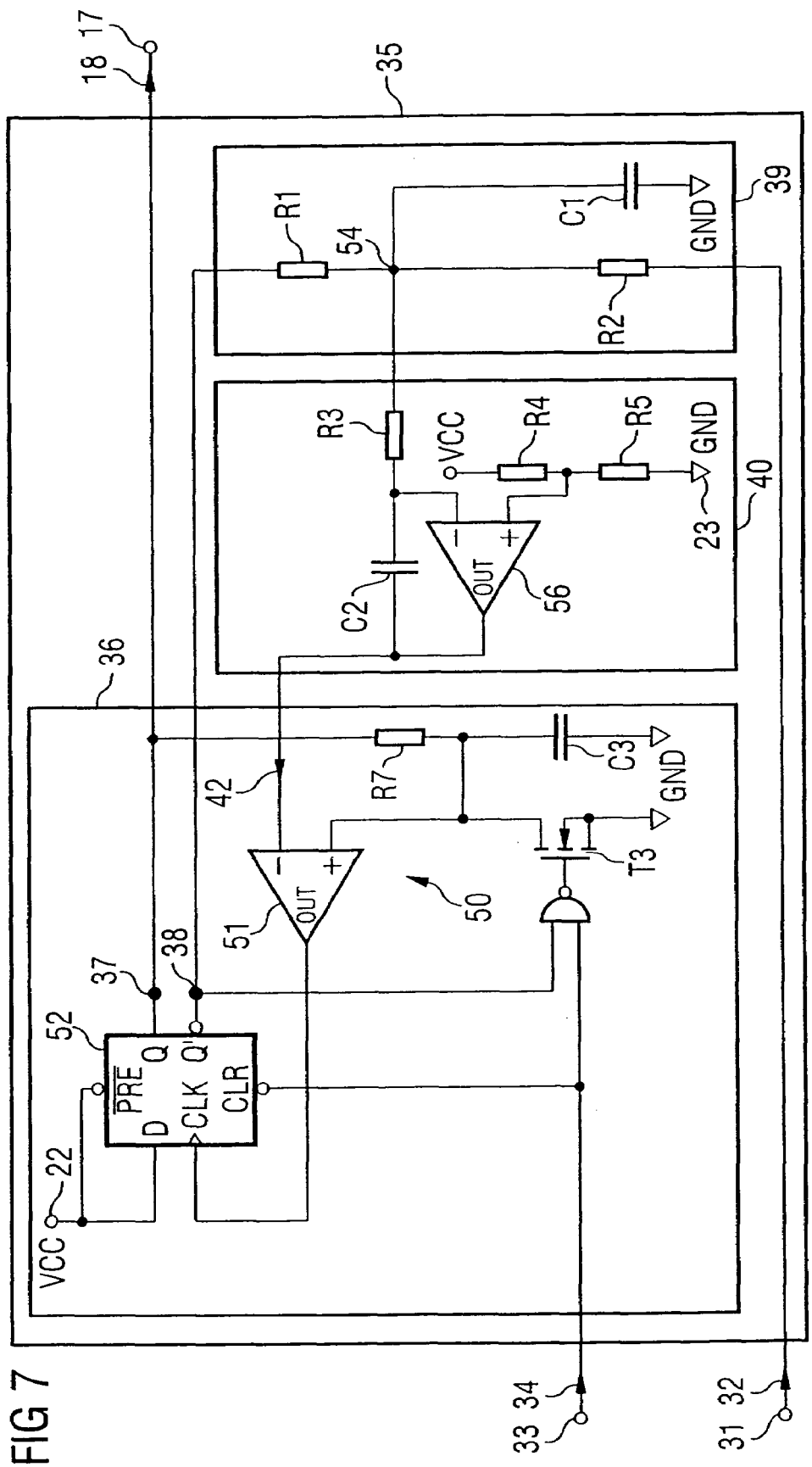
FIG. 7 shows a second, simplified embodiment of a PWM regulating circuit.

With the aid of a circuit diagram, FIG. 7 shows a second embodiment for implementing the PWM regulating circuit 35. In contrast to the embodiment in FIG. 5, the PWM modulator 36, and here in particular the ramp generator 50 for driving the comparator 51, has been implemented more simply in circuitry terms. In contrast to the embodiment in FIG. 5, the current balancing circuit R6, T1, T2 has been replaced by a simple resistor R7 which is connected to the non-inverting output 37 of the flip-flop 52. As a result, the capacitor C1 of the addresser 39 is charged already during the integration phase (Q=HIGH level), whereas the resistor R7 is set to a no-current state (Q=LOW level) when the ramp generator 50 is reset. The ramp voltage generated by the ramp generator 50 now has the form of an exponential charging curve, which is compensated by the regulator 40.

Although the present invention was described above with the aid of preferred embodiments, it is not restricted to these and can be modified in multifarious ways.

The invention is not, for instance, necessarily restricted to ANC systems for the purpose of noise suppression in a motor vehicle but can of course be applied advantageously to any other applications.

Nor is the use of a microcontroller which makes a PWM signal available at one of its outputs a necessary requirement for the drive circuit. Rather this PWM signal can also be provided by a suitable other circuit, such as a modulator circuit.

Nor is the invention restricted to microcontrollers. Rather the function of a microcontroller to which the PWM regulating circuit according to the invention is connected upstream can also be implemented by any other program-controlled unit, for example a microprocessor or signal processor and the like.

In particular the invention is of course not restricted to the numbers given above but can be modified in any way within the scope of specialist technical knowledge.

The specific circuit variants that are given solely represent possible embodiments that can be very simply modified by replacing simple components without departing from the fundamental function of the PWM regulating circuit or the object of the present invention.

It should finally be noted that although the adding device, regulator, PWM modulator, pre-amplifier, and output filter are designed in the present embodiment as hardware components, these elements or parts thereof can of course also be implemented by means of software functions.

The invention claimed is:

1. Drive circuit for driving an output stage of a device for noise suppression, in particular in a motor vehicle, comprising:
    a first input for coupling in an unmodulated first clock signal of a first frequency,
    a second input for coupling in a PWM-modulated second clock signal of a second, lower frequency,
    a modulator circuit which from the first clock signal generates a PWM-modulated third clock signal of the first frequency which can be tapped at a PWM output of the drive circuit, and
    a regulating circuit which regulates the pulse width of the third clock signal until a sum of a pulse duty factors of the second clock signal and of an inverted third clock signal is 100%.

2. Drive circuit according to claim 1, wherein the regulating circuit has an addresser, wherein the regulating circuit generates a first regulating signal from the sum of the second clock signal and of the inverted third clock signal.

3. Drive circuit according to claim 2, wherein the addresser has a first voltage divider whose resistors have the same conductance.

4. Drive circuit according to claim 2, wherein the regulating circuit has a first comparator which generates the first regulating signal for driving the modulator circuit as a function of a difference between a reference potential and a summation signal generated by the addresser.

5. Drive circuit according to claim 4, wherein the addresser has a first voltage divider whose resistors have the same conductance and wherein the reference potential includes a second voltage divider coupled between a voltage supply and ground.

6. Drive circuit according to claim 1, wherein the regulating circuit is designed as a PID regulator and/or as an I regulator.

7. Drive circuit according to claim 4, wherein the modulator circuit has a NAND gate, a downstream ramp generator, second comparator, and flip-flop.

8. Drive circuit according to claim 7, wherein the ramp generator has a switchable current source and an integration capacitor for generating a ramp voltage.

9. Drive circuit according to claim 7, wherein the second comparator is connected on the input sides to the output of the ramp generator and to the output of the regulating circuit, wherein the second comparator comparing a ramp voltage with the first regulating signal, for generating a trigger signal for triggering the flip-flop.

10. Drive circuit according to claim 7, wherein the flip-flop is connected on the input sides to the first input and to the output of the second comparator, wherein the flip-flop produces the third clock signal and an inverted clock signal with respect to the third clock signal as a function of a trigger signal and of the first clock signal.

11. Drive circuit according to claim 1, wherein the drive circuit is a peripheral device within a program-controlled unit, in particular within a microcontroller or microprocessor.

12. Devices for electronic noise suppression, in particular for a motor vehicle comprising:
    a microphone for registering noises,
    a loudspeaker for feeding out acoustic signals for noise suppression,
    a circuit arrangement for driving the loudspeaker according to the registered noises which has a drive circuit for provisioning a PWM-modulated clock signal, comprising:
        a first input for coupling in an unmodulated first clock signal of a first frequency,
        a second input for coupling in a PWM-modulated second clock signal of a second, lower frequency,
        a modulator circuit which from the first clock signal generates a PWM-modulated third clock signal of the first frequency which can be tapped at a PWM output of the drive circuit, and
        a regulating circuit which regulates the pulse width of the third clock signal until a sum of a pulse duty factors of the second clock signal and of an inverted third clock signal is 100%,
    and
    an output stage which is connected immediately downstream of the drive circuit and which drives the loudspeaker.

13. Device according to claim 12, wherein the output stage is designed as a class D amplifier.

14. Device according to claim 12, wherein the output stage has a driver circuit and a bridge circuit, in particular a full bridge, which is connected downstream of the driver circuit.

15. Device according to claim 14, wherein a program-controlled unit, in particular a microcontroller or microprocessor, is provided which is connected immediately upstream of the driver circuit or which includes the driver circuit.

16. Device according to claim 12, wherein the output stage is driven directly by a microcontroller.

17. Method for driving an output stage of a device for noise suppression, in particular in a motor vehicle, comprising the steps of:
    generating from an unmodulated first clock signal of a first frequency and from a PWM-modulated second clock signal of a second frequency, which is lower than the first frequency, a PWM-modulated third clock signal of the first frequency whose pulse duty factor continues being increased on a regulated basis until a sum of pulse duty factors of the second clock signal and of an inverted third clock signal is 100%,
    using the frequency of the first clock signal as a control variable, and
    using the third clock signal as a regulating variable for regulation.

18. Method according to claim 17, wherein the first and/or second clock signal are/is made available by a program-controlled unit.

19. Method according to claim 17, wherein a flip-flop is used for generating the pulse width of the PWM-modulated third clock signal.

20. A method according to claim 17, comprising the step of using a microprocessor or microcontroller for directly driving an output stage, in particular a class D output stage, with a PWM-modulated clock signal in the device for electronic noise suppression.

* * * * *